United States Patent
Stolpman (10) Patent No.: US 9,657,564 B2
(45) Date of Patent: May 23, 2017

(54) METHODS AND APPARATUS HAVING BOREHOLE SEISMIC WAVEFORM COMPRESSION

(71) Applicant: HALLIBURTON ENERGY SERVICES, INC., Houston, TX (US)

(72) Inventor: Victor Stolpman, The Woodlands, TX (US)

(73) Assignee: HALLIBURTON ENERGY SERVICES, INC., Houston, TX (US)

(*) Notice: Subject to any disclaimer, the term of this patent is extended or adjusted under 35 U.S.C. 154(b) by 285 days.

(21) Appl. No.: 14/349,744

(22) PCT Filed: Oct. 1, 2012

(86) PCT No.: PCT/US2012/058330
§ 371 (c)(1),
(2) Date: Apr. 4, 2014

(87) PCT Pub. No.: WO2013/052423
PCT Pub. Date: Apr. 11, 2013

(65) Prior Publication Data
US 2014/0362664 A1 Dec. 11, 2014

Related U.S. Application Data

(60) Provisional application No. 61/543,616, filed on Oct. 5, 2011.

(51) Int. Cl.
*G01V 3/00* (2006.01)
*E21B 47/16* (2006.01)
(Continued)

(52) U.S. Cl.
CPC .............. *E21B 47/16* (2013.01); *E21B 47/12* (2013.01); *G01V 1/48* (2013.01); *G01V 11/002* (2013.01);
(Continued)

(58) Field of Classification Search
CPC .......... E21B 47/12; E21B 47/14; E21B 47/16; E21B 47/18; E21B 47/182; G01V 1/00;
(Continued)

(56) References Cited

U.S. PATENT DOCUMENTS 3,860,759 A * 1/1975 Miller ....................... H04B 1/66
367/14
4,027,282 A * 5/1977 Jeter ....................... E21B 47/16
367/85
(Continued)

FOREIGN PATENT DOCUMENTS

EP 1483601 10/2010
WO WO-2013/052423 4/2013

OTHER PUBLICATIONS

PCT International Search Report and Written Opinion, dated Feb. 1, 2013, Appl No. PCT/US2012/058330, "Methods and Apparatus Having Borehole Seismic Waveform Compression", filed Oct. 1, 2012, 14 pgs.
(Continued)

*Primary Examiner* — Ryan Sherwin
(74) *Attorney, Agent, or Firm* — Iselin Law PLLC; Benjamin Fite (57) ABSTRACT

An illustrative seismic while drilling system includes a drill string having at least one seismic sensor that can be employed to detect seismic signals during pauses in the drilling process, e.g., when extending the length of the drill string. An embedded processor digitizes a signal from the seismic sensor to obtain a digital waveform and processes the digital waveform to derive a compressed waveform representation for storage or transmission. Compression is provided by adaptively reducing the sampling rate and quantization resolution subject to one or more quality constraints including, e.g., error in first break timing, error in first break sign, mean square error, and bit count. Reasonably good representations of the received acoustic waveforms can be achieve with less than 200 bits.

17 Claims, 7 Drawing Sheets

(51) Int. Cl.
  *E21B 47/12* (2012.01)
  *H03M 7/30* (2006.01)
  *G01V 1/48* (2006.01)
  *G01V 11/00* (2006.01)

(52) U.S. Cl.
  CPC ....... *H03M 7/3059* (2013.01); *G01V 2200/16* (2013.01)

(58) Field of Classification Search
  CPC . G01V 1/001; G01V 1/22; G01V 1/24; G01V 1/28; G01V 1/32; G01V 1/325; G01V 1/48; G01V 11/00; G01V 11/002
  See application file for complete search history.

(56) References Cited

U.S. PATENT DOCUMENTS

| | | | |
|---|---|---|---|
| 5,031,155 | A | 7/1991 | Hsu |
| 5,519,668 | A | 5/1996 | Montaron |
| 5,594,706 | A | 1/1997 | Shenoy et al. |
| 6,078,868 | A | 6/2000 | Dbinsky |
| 6,943,709 | B2 | 9/2005 | Blanch et al. |
| 7,107,153 | B2 | 9/2006 | Kisra et al. |
| 7,274,990 | B2 | 9/2007 | Mathiszik et al. |
| 7,299,884 | B2 | 11/2007 | Mathiszik |
| 7,389,184 | B2 | 6/2008 | Mathiszik et al. |
| 7,418,348 | B2 | 8/2008 | Woerpel et al. |
| 7,463,551 | B2 | 12/2008 | Leggett, III et al. |
| 7,652,951 | B2 | 1/2010 | Leggett, III et al. |
| 7,710,822 | B2 | 5/2010 | Harmon |
| 7,770,663 | B2 | 8/2010 | Mathiszik |
| 2005/0222775 | A1 | 10/2005 | Kisra et al. |
| 2006/0055556 | A1* | 3/2006 | Memarzadeh .......... E21B 47/12 340/870.07 |
| 2007/0097786 | A1 | 5/2007 | Wu et al. |
| 2009/0190850 | A1 | 7/2009 | Tang |
| 2010/0315901 | A1 | 12/2010 | Coman et al. |

OTHER PUBLICATIONS

Song, Fuxian, et al., "An Improved Method for Hydrofracture-Induced Microseismic Event Detection and Phase Picking", Geophysics, vol. 75, No. 6, (Nov.-Dec. 2010), p. A47-A52, 6 FIGS.
Althoff, Gary, et al., "New Concepts for Seismic Surveys While Drilling", 2004 SPE Annual Technical Conference and Exhibition held in Houston, Texas, U.S.A., SPE 90751, (Sep. 26-29, 2004), 12 pgs.
Haldorsen, Jakob B., et al., "An Improved Method for Hydrofracture-Induced Microseismic Event Detection and Phase Picking", SPE/IADC Drilling Conference held in Amsterdam, The Netherlands, (Feb. 19-21, 2003), SPE/IADC 79844, 7 pgs.
Earle, Paul S., et al., "Characterization of Global Seismograms Using an Automatic-Picking Algorithm", Bulletin of the Seismological Society of America, vol. 84, No. 2, Apr. 1994, pp. 366-376.
Harrold, T., et al., "Seismic Measurement While Drilling in Azerbaijan and Brazil", IADC/SPE Drilling Conference held in Dallas, Texas, IADC/SPE 74539, (Feb. 26-28, 2002), 6 pgs.
Anchliya, A. "A Review of Seismic-While-Drilling (SWD) Techniques: A Journey From 1986 to 2005", SPE Europec/EAGE Annual Conference and Exhibition held in Vienna, Austria, SPE 100352, (Jun. 12-15, 2006), 27 pgs.
International Preliminary Report on Patentability, dated Apr. 17, 2014, Appl No. PCT/US2012/058330, "Methods and Apparatus Having Borehole Seismic Waveform Compression", filed Oct. 1, 2012, 8 pgs.
GCC Examination Report, dated Feb. 4, 2016, "Methods and Apparatus Having Borehole Seismic Waveform Compression," Appln No. GC 2014-22463, Filing date Oct. 6, 2012, 6 pgs.
CN Office Action, dated Feb. 2, 2016, "Methods and Apparatus Having Borehole Seismic Waveform Compression," Appl. No. 201280044863.8, Filing date Oct. 1, 2012, 11 pgs.
RU Substantive Examination, dated Mar. 27, 2015, "Methods and Apparatus Having Borehole Seismic Waveform Compression," Appl. No. 2014110956/03(017272), Filing date Oct. 1, 2012, 9 pgs.
EP Extended Search Report, dated May 12, 2015, "Methods and Apparatus Having Borehole Seismic Waveform Compression," Appl. No. 12837903.9, Filing date Oct. 1, 2012, 7 pgs.
AU Examination Report No. 1, dated Apr. 12, 2015, "Methods and Apparatus Having Borehole Seismic Waveform Compression," Appl. No. 2012318822, Filing date Oct. 1, 2012, 3 pgs.
CA Examiner's Letter, dated Mar. 20, 2015, "Methods and Apparatus Having Borehole Seismic Waveform Compression," Appl. No. 2,846,968, Filing date Oct. 1, 2012, 3 pgs.
AU Patent Examination Report, dated Aug. 10, 2016, "Methods and Apparatus Having Borehole Seismic Waveform Compression," Appl No. 22016202309, Filed Oct. 1, 2012, 2 pgs.
CN Second Office Action, dated Sep. 8, 2016, "Methods and Apparatus Having Borehole Seismic Waveform Compression," Appl No. 201280044863.8, Filed Oct. 5, 2011, 26 pgs.

\* cited by examiner

METHODS AND APPARATUS HAVING BOREHOLE SEISMIC WAVEFORM COMPRESSION

CROSS-REFERENCE TO RELATED APPLICATIONS

The present application claims priority to Provisional U.S. Pat. App. No. 61/543,616, titled "Methods and Apparatus Having Borehole Seismic Waveform Compression" and filed Oct. 5, 2011. This application is hereby incorporated herein by reference.

BACKGROUND

Current development of logging/measuring while drilling have enabled the development of new seismic tools that acquire and transmit seismic data in real time during the drilling process without impairing rig operations. This Seismic While Drilling (SWD) technology may significantly impact (positively) the cost of exploration and development drilling, particularly in deepwater environment and other areas with significant seismic uncertainties. The primary application of SWD is to locate the well properly in the seismic section so the driller can guide the well towards a target. SWD can further aid the driller with other drilling decisions including setting, coring, and casing points; drilling hazard avoidance; and overpressure zone identification.

In SWD, time-domain waveforms are captured by digitizing signal responses of a rock formation to an acoustic source at remote point relative to one or more microphones (e.g. hydrophones and/or geophones). Processors at the surface process the seismic time-domain data and translate it into a space-domain representation. In order to accomplish this, these processors employ a velocity model, which is usually estimated from the seismic data itself. However, the errors associated with these estimates can be quite large, especially in exploration areas where well information is scarce or non-existent. Such errors may result in the reflectors (and thus targets) being placed incorrectly in space. In order to properly place the well that is being drilled, either the seismic versus time profile or seismic versus depth profile is desired. Both of these can be achieved via SWD.

Seismic while drilling can potentially be done in at least three distinct ways: 1) using a downhole source (active or drill bit) and surface receivers; 2) using an active seismic source on the surface and one or more receivers downhole; 3) using both a downhole source and downhole receivers. The early commercial SWD services employed the first approach. However, with the advance of PDC bits, the drill bit signal was found in many situations to be too weak to serve as a useful seismic source.

The latter two options employ downhole receivers. Conventional drilling systems employ notoriously low-data-rate mud pulse telemetry systems to communicate downhole measurements to the surface. The bandwidth constraints of such systems make it infeasible to communicate all of the collected waveforms to the surface for processing, visualization, and interpretation. Previous attempts to address this issue are believed to be inadequate.

BRIEF DESCRIPTION OF THE DRAWINGS

Accordingly, there are disclosed in the drawings and the following description specific apparatus and method embodiments employing borehole seismic waveform compression to at least partly address this issue. In the drawings.

It should be understood, however, that the specific embodiments given in the drawings and detailed description thereto do not limit the disclosure, but on the contrary, they provide the foundation for one of ordinary skill to discern the alternative forms, equivalents, and modifications that are encompassed with the given embodiments by the scope of the appended claims.

DETAILED DESCRIPTION

Figure 1:
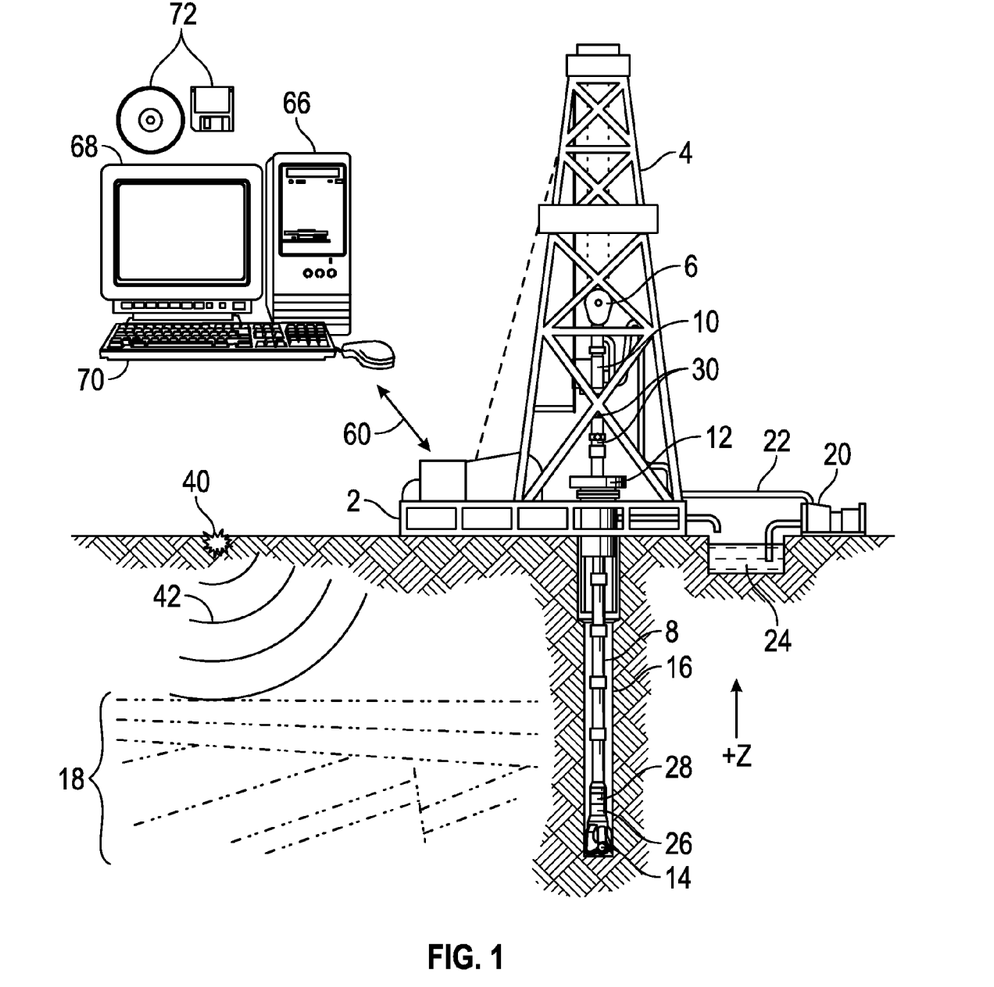
FIG. 1 shows an illustrative seismic while drilling (SWD) environment.

FIG. 1 shows an illustrative seismic while drilling (SWD) environment. A drilling platform 2 is equipped with a derrick 4 that supports a hoist 6 for raising and lowering a drill string 8. The hoist 6 suspends a top drive 10 suitable for rotating the drill string 8 and lowering the drill string through the well head 12. Connected to the lower end of the drill string 8 is a drill bit 14. As bit 14 rotates, it creates a borehole 16 that passes through various formations 18. A pump 20 circulates drilling fluid through a supply pipe 22 to top drive 10, down through the interior of drill string 8, through orifices in drill bit 14, back to the surface via the annulus around drill string 8, and into a retention pit 24. The drilling fluid transports cuttings from the borehole into the pit 24 and aids in maintaining the integrity of the borehole 16.

A logging tool suite 26 is integrated into the bottom-hole assembly near the bit 14. As the bit 14 extends the borehole through the formations, logging tool 26 collects measurements relating to various formation properties as well as the tool orientation and various other drilling conditions. During pauses in the drilling process (e.g., when the drill string 8 is extended by the addition of an additional length of tubing), the tool suite 26 collects seismic measurements. As the pump 20 is normally off during this extension process, the downhole environment is generally quiet during these pauses. The bottomhole assembly can be configured to automatically detect such pauses and to initiate a programmable time window for recording any received seismic waveforms.

At predetermined time intervals, a seismic source 40, e.g., a surface vibrator or an air gun, is triggered to create a "shot", i.e., a burst of seismic energy that propagates as seismic S-waves and/or P-waves 42 into the subsurface.

Such waves undergo partial transmission, reflection, refraction, and mode transformation at acoustic impedance changes such as those caused by bed boundaries, fluid interfaces, and faults. The tool suite 26 includes seismic sensors to detect the modified seismic waves reaching the bottomhole assembly. Data is recorded in downhole memory when each shot is fired on the surface. The tool suite 26 (and the other system components) has a high-accuracy clock to ensure that the recorded measurements' timing can be synchronized to the timing of the shot. One possible synchronization approach is to synchronize the bottomhole assembly clock to the clock information in the Global Positioning System (GPS) prior to insertion into the borehole.

The tool suite 26 may take the form of one or more drill collars, i.e., a thick-walled tubulars that provide weight and rigidity to aid the drilling process. The tool suite 26 further includes a navigational sensor package having directional sensors for determining the inclination angle, the horizontal angle, and the rotational angle (a.k.a. "tool face angle") of the bottomhole assembly (BHA). As is commonly defined in the art, the inclination angle is the deviation from vertically downward, the horizontal angle is the angle in a horizontal plane from true North, and the tool face angle is the orientation (rotational about the tool axis) angle from the high side of the wellbore. In accordance with known techniques, directional measurements can be made as follows: a three axis accelerometer measures the earth's gravitational field vector relative to the tool axis and a point on the circumference of the tool called the "tool face scribe line". (The tool face scribe line is typically drawn on the tool surface as a line parallel to the tool axis.) From this measurement, the inclination and tool face angle of the BHA can be determined. Additionally, a three axis magnetometer measures the earth's magnetic field vector in a similar manner. From the combined magnetometer and accelerometer data, the horizontal angle of the BHA may be determined. Inertial and gyroscopic sensors are also suitable and useful for tracking the position and orientation of the seismic sensors.

A mud pulse telemetry sub 28 is included to transfer measurement data to a surface receiver 30 and to receive commands from the surface. The telemetry sub 28 operates by modulating the flow of drilling fluid to create pressure pulses that propagate along the fluid column between the bottom-hole assembly and the surface. (Mud pulse telemetry generally requires a flow of drilling fluid and thus is not performed while the pump is off.)

The mud pulse telemetry receiver(s) 30 are coupled to a data acquisition system that digitizes the receive signal and communicates it to a surface computer system 66 via a wired or wireless link 60. The link 60 can also support the transmission of commands and configuration information from the computer system 66 to the bottomhole assembly. Surface computer system 66 is configured by software (shown in FIG. 1 in the form of removable storage media 72) to monitor and control downhole instruments 26, 28. System 66 includes a display device 68 and a user-input device 70 to enable a human operator to interact with the system control software 72.

Thus SWD systems can be broadly partitioned into two components: a surface system and a downhole system that work in a synchronized fashion. The surface system may include an acoustic source 40 and at least a single processing unit 66 typically executing microcode to control the actuation of the acoustic source. Other embodiments may involve dedicated hardware to control the actuation of the acoustic source 40. Often the acoustic source 40 may be an air-gun or a seismic vibrator (e.g. Vibroseis) possibly fired/vibrated within predetermined time intervals. They operate to excite an acoustic signal that propagates through rock formations to the downhole systems. For offshore operations, the acoustic signal may propagate through water in addition to a rock formation.

As described previously, the downhole SWD component may be a part of a Logging While Drilling (LWD) or Measurement While Drilling (MWD) subsystem used in providing L/MWD services, respectively. The teachings herein may also apply to wireline services, in which the downhole component is part of a wireline logging sonde. An illustrative Logging While Drilling (LWD) downhole system providing SWD services may include at least one embedded processing system capable of synchronizing operations with predetermined time intervals also used by the surface system, receiving at least one copy of the acoustic signal from the surrounding rock formation, digitizing and storing of the received acoustic signals, and compression and transmission of at least some of the received acoustic signals to the surface system. In typical embodiments, the surface subsystem may download or configure the predetermined time intervals within the downhole subsystem at the surface prior to entering the borehole via communication link (tethered or otherwise).

The digitized acoustic signals acquired during the predetermined time intervals are compressed. Digital waveform compression of received waveforms may be used with either LWD or MWD services for either or both storage and transmission. For storage, the waveform compression's utility lies in the ability to increase the storage density of a given finite FLASH memory, or other non-volatile memory. Thus, digital waveform compression may enable more recorded waveforms for either additional accuracy or for longer operation periods relative to a comparable LWD downhole apparatus without compression. For transmission, the waveform compression's utility focuses on increasing the throughput of digitized waveforms through a communication channel when transmitted to the surface systems in addition to any possible improved storage density. Thus, compression may enable timely transmission of digitized, received waveforms at an effective data rate that enables real-time SWD service and does not negatively impact other MWD services. For wireline systems, compression benefits are similar to L/MWD benefits with the possibility of additional waveform sampling densities, i.e. more waveforms per linear foot.

As an alternative to predetermined timing intervals, the shots (and recording intervals) may be event driven. For example, they may be actuated by commands from the surface computer system 66, which can be communicated via mud pulse downlink telemetry or via cycling of the circulation pump between on and off states. As another example, the timing may be set as part of the pump cycle. A pump cycle is where the surface mud pumps are cycled between off and on states, e.g. "on to off to on" is a full cycle.

The ability to detect these events may exist elsewhere in the L/MWD subsystem, and through an inter-tool communication system, the downhole SWD component receives a message indicating such an event occurred or a command to act in response to the event. In these embodiments, the downhole apparatus listens/monitor (receives) for trailing acoustic reflections off of surrounding rock formations, i.e. "echoes." The digital waveform compression of at least one digitized acoustic signal received facilitates either or both storage and/or transmission purposes.

The source 40 need not be on the surface, and in some contemplated embodiments, it is included as part of the drillstring. For example, the downhole seismic subsystems may further include a piezoelectric transducer such as those found in Halliburton's Acoustic Caliper and/or SONIC/BAT downhole tools. The triggering of the downhole source corresponds with the timing of the recording intervals, e.g., in an event-driven fashion or at predetermined time intervals configured by the surface system prior to the downhole system entering into the borehole.

The following references supply additional detail which may prove helpful to the understanding of SWD concepts herein. They are hereby incorporated herein by reference:

[1] Fuxian Song, H. Sadi Kulcli, M. Nafi Toksöz, Erkan Ay, and Haijiang Zhang, An improved method for hydrofracture-induced microseismic event detection and phase picking, Geophysics, Volume 75, Issue 6, 2010.

[2] Gary Althoff and Bruce Cornish; Halliburton Energy Services; Georgious Varsamis, Balaji Kalaipatti, Abbas Arian, Laurence T. Wisniewski, Joakim O. Blanch and Arthur C. Cheng; SensorWise Inc., New Concepts for Seismic Survey While Drilling, SPE 90751, 2004.

[3] Jakob B. U. Haldorsen, Cengiz Esmersoy, and Andrew Hawthorn, Schlumberger; Mary L. Krasovec, Massachusetts Institute of Technology; Sue Raikes, Toby Harrold, and David N. Day, B P plc; and James D. Clippard, Shell E&P Technology Co., Optimizing the Well Construction Process: Full-Waveform Data From While-Drilling Seismic Measurements in the South Caspian Sea., SPE/IADC 79844, 2003.

[4] Paul S. Earle, and Peter. M. Shearer, 1994, Characterization of global seismograms using an automatic-picking algorithm: Bulletin of the Seismological Society of America, 84, 366-376

[5] T. Harrold, A. Poole, L. Nelson, A. Hawthorn, W. Underhill, Seismic Measurement While Drilling in Azerbaijan and Brazil, In Proceedings of IADC/SPE Drilling Conference, Dallas, Tex. February 2002.

[6] Anchliya, A Review of Seismic-While-Drilling (SWD) Techniques: A Journey From 1986 to 2005, In Proceedings of SPE Europe/EAGE Annual Conference and Exhibition held in Vienna, Austria, 12-15 Jun. 2006.

Figure 2:
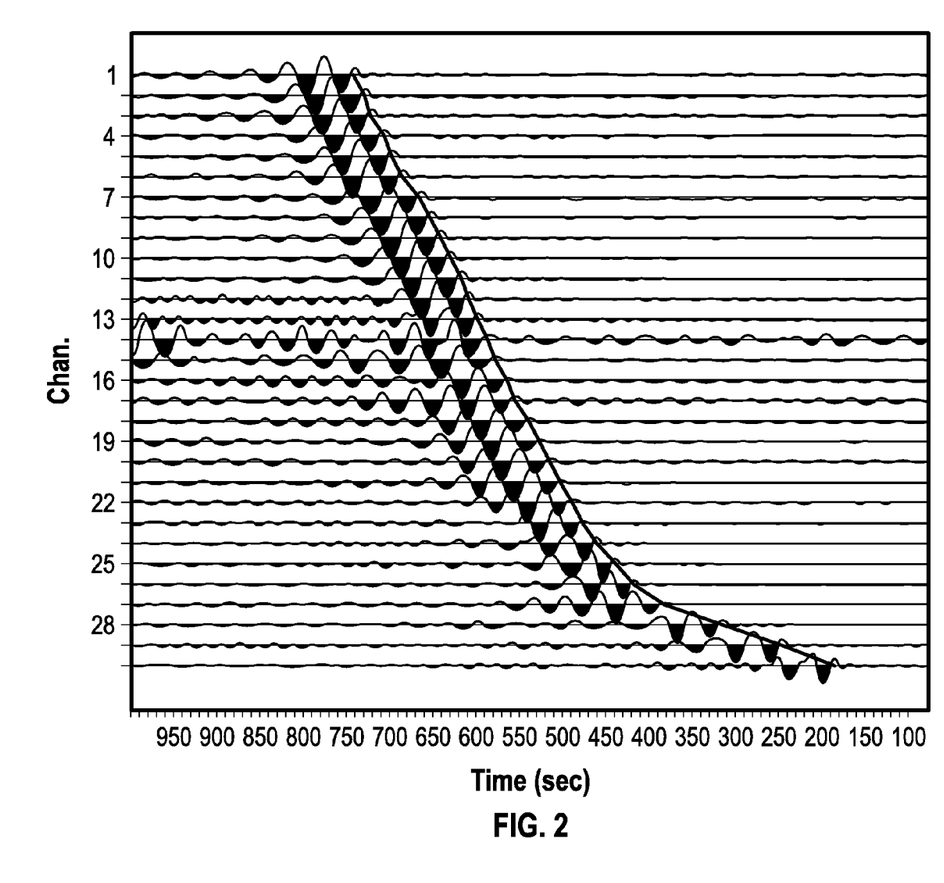
FIG. 2 shows an illustrative graph of raw, unfiltered SWD waveforms captured at different depths.

The received acoustic waveforms contain useful information for drilling purposes. When available at the surface, the received acoustic waveforms may be plotted across time and depth to construct a seismic image (see, e.g., FIG. 2). The challenge, then, is to communicate the receive acoustic waveforms from the downhole tool that receives these waveforms (deep within a borehole) to the surface computer system. Ideally, full waveforms would be sent uphole for real time processing, visualization and interpretation (FIG. 2), but such is not feasible. Indeed, in many cases it may even be infeasible to just store all of the recorded waveforms in the tool's memory. Accordingly, there is disclosed herein digital compression techniques to facilitate communication of an adequate number of waveforms to the surface for near real time analysis and to further facilitate the storage of a greater number of waveforms in a memory of a given capacity. The disclosed compression techniques are applicable not only to mud pulse telemetry systems and data storage, but also for use with other telemetry systems (including, e.g., electromagnetic telemetry, acoustic telemetry, and wireline telemetry).

One illustrative 8-inch SWD tool captures acoustic waveform data in the following format: 32 bits/sample at a sampling frequency of 2035 samples/sec for at least 2 minutes for each of eight acoustic receive transducers (4 hydrophones and 4 geophones). Thus without additional signal processing and compression to reduce the aggregate bit count, the total digitized received set of waveforms total is 8 signals×32 bits/sample×2035 samples/sec×120 sec=62,515,200 bits, i.e. 7,814,400 bytes. Even given an aspirational mud pulse telemetry rate of 15 bits of information per second, the total time to transmit is 48.23 days. Even one transducer for 0.5 second consists of 32×2035×0.5=32,560 bits and would take ~36 minutes to transmit with the rate of 15 bits/sec, a prohibitive time interval for drilling operations relying on MWD for information other than a SWD waveform.

A more typical mud pulse telemetry rate is ~3 bits/sec, pushing the time to transmit a single 0.5 sec waveform to ~3 hours. For a more manageable SWD system relying on mud pulse telemetry, we believe a single processed digitized received waveform should be compressed to no more than about ~190 bits. The methods disclosed herein can accomplish this, putting the transmission time on the order of 1 minute for 3 bits/sec telemetry rates. At every stand (3 sections of pipe or ~90 feet), the 1 minute taken for SWD waveform telemetry is quite acceptable and should not affect negatively other drilling operations relying on mud pulse telemetry. Even when limited to less than 200 bits per waveform, we can provide SWD waveforms of sufficient quality to provide useful information for the driller during the current drilling run without pulling out of the hole for a tool reading.

A suitable goal for the disclosed implementations of SWD technology would be to produce "Vertical Seismic Profile" surveys in real-time, where the full seismic wave forms are promptly sent to surface via mud pulse telemetry. In this context, a "full" wave form is a time-domain waveform in, say, a 512 msec window around the first break arrival time. A series of such waveforms would enable the seismic velocity profile to be continuously updated to facilitate the proper positioning of the well in the seismic time/location. Real-time VSP analysis with full seismic waveforms further assists in identifying/interpreting reflections and corridor stacks for seismic ties and look-ahead applications, and saves the extra time and money that might otherwise be spent on a wireline VSP survey for the same purpose.

The disclosed methods and apparatus may adaptively adjust the filtering, sampling and quantization of received acoustic waveforms, with a quality measure that uses a plurality of perceptual parameters relied on by seismic analysts to interpret Vertical Seismic Profiles. The resulting data compression facilitates the storage and/or transmission of a plurality of digitized received seismic waveforms that retain features important to seismic log-analysts for recorded and/or real-time applications. Many embodiments both at the surface and downhole allow for user defined/customized weighting parameters that may be used in a weighted linear fashion and/or in a nonlinear gateway fashion (i.e. if the break time is less than some threshold, then check the weighted perception parameters against another threshold, e.g. sign, amplitude, mean-squared error).

Figure 3:
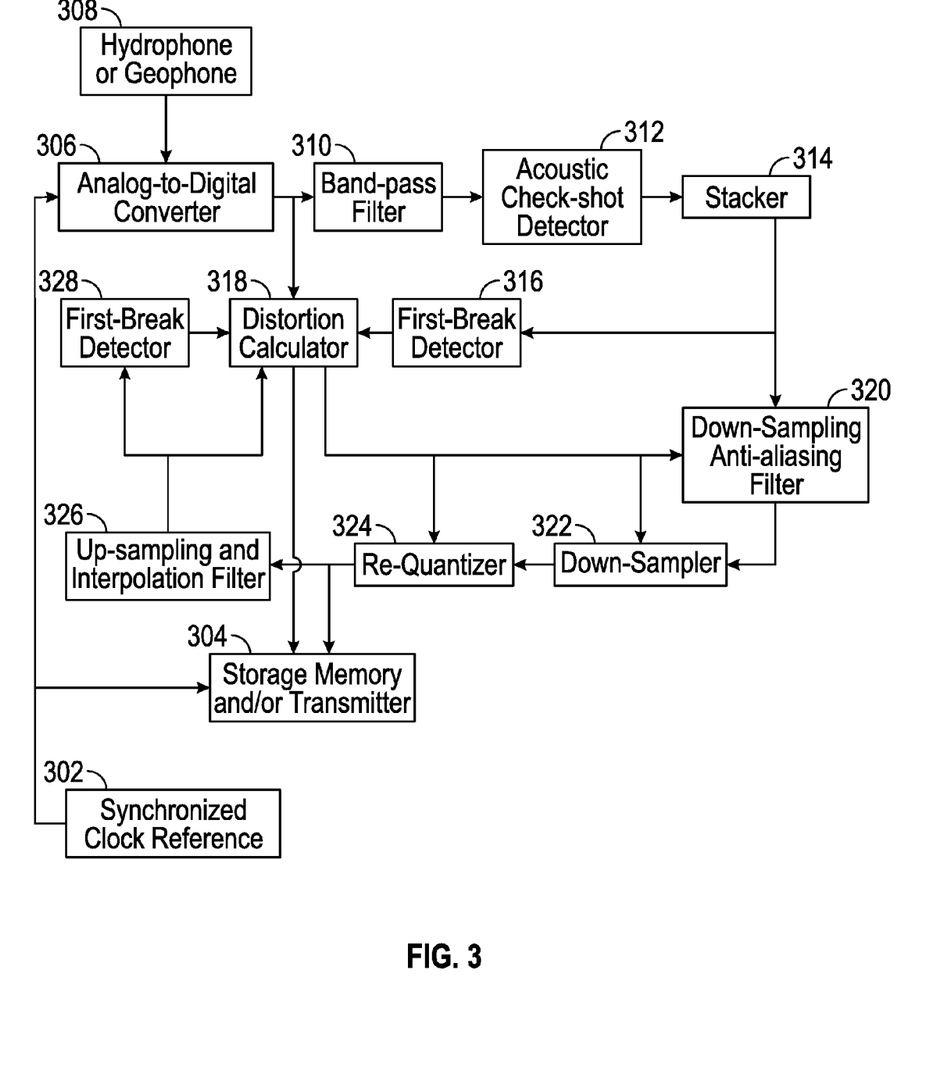
FIG. 3 is a block diagram of an illustrative encoder that provides borehole seismic waveform compression.

FIG. 3 shows an illustrative compression process for the received digital waveforms. A high-accuracy clock 302 for the tool is synchronized to that of the surface systems, e.g., by means of a GPS reference clock before the tool is deployed downhole. (Other synchronization techniques are known and may be employed.) The downhole tool determines the recording time intervals and sampling times based at least in part on the clock 302. A tool module 304 for data storage and/or communication to the surface tags the measurements with a time reading from the clock 302.

During the recording windows, one or more A/D converters 306 begin sampling the signals from one or more seismic sensors 308. A bandpass filter 310 isolates the frequency range of interest, screening out the high frequency noise and potentially blocking any DC component. A shot profile detector 312 detects and separates the individual waveforms. (Often the source fires a series of shots in the recording interval. The shot profile detector defines a time window for each shot, thereby separating the digitized signal into individual waveforms.) The stacker 314 averages the individual waveforms from a given shot series together, thereby improving the signal to noise ratio.

A first-break detector 316 processes the stacked waveform to identify the "start" of the received acoustic waveform, which corresponds to the first arrival of seismic energy from the shot. (Standard detection techniques are available in the literature and may include, for example, identifying the zero crossing preceding the first peak that exceeds a predetermined threshold.) A distortion calculator 318 operates on this start point and/or other information derived from the stacked waveform, comparing them to corresponding measures derived from a reconstructed waveform to derive a measure of distortion caused by the compression process. Suitable distortion measures include start point error and mean-square error between the stacked waveform and the reconstructed waveform, or a combination thereof. Based on the distortion measure, the distortion calculator adapts the compression parameters to maximize compression subject to limits on the distortion. Illustrative compression parameters include: sample quantization, sampling rate, and anti-aliasing filter cutoff.

An anti-aliasing ("downsampling") filter 320 performs a low-pass filtering operation on the stacked signal to suppress any frequency content above a programmable cutoff frequency, to enable the ensuing downsampler 322 to operate without creating frequency aliasing. The maximum cutoff frequency is limited by the desired downsampling rate, but it can be lower if desired.

Downsampler 322 reduces the sampling rate of the filtered waveform, employing interpolation if needed (e.g., when the original sampling rate is not an integer multiple of the reduced sampling rate). The downsampled waveform is then re-quantized by re-quantizer 324. Re-quantizer 324 represents each waveform sample with a smaller number of bits, e.g., two or three bits per sample rather than 32 bits per sample. The re-quantizer 324 may employ evenly-spaced quantization thresholds, but even spacing is not a requirement. Some embodiments may employ nonuniform quantization threshold spacing. In any event, effective re-quantization generally employs some form of waveform normalization, i.e., a gain term that can be applied to the wave form at, or at nearly any point upstream of, the re-quantizer 324.

The output of re-quantizer 324 is a compressed waveform, but before it is accepted as a suitable representation for storage and/or transmission, a reconstructor 326 upsamples and filters the compressed signal to provide a reconstructed estimate of the stacked waveform. A first-break detector 328 operates on the reconstructed estimate to identify the start of the received acoustic waveform in the same fashion as detector 316. The distortion calculator 318 compares the start times from detectors 316 and 328 and/or the mean square error between the reconstructed estimate and the stacked waveform to derive a distortion measure. If the distortion measure is too high, one or more of the compression parameters is adjusted to permit more bits to be used in the compressed representation. Conversely, if the distortion measure is far enough below the limit, the compression parameters may be adjusted to reduce the number of bits used for the compressed representation. When an acceptable distortion measure is attained, the compressed representation may be stored and/or communicated by module 304 with an appropriate time stamp attached. As part of the storage and/or transmission, an entropy coding scheme (differential encoding, Huffman, etc) may be employed to further reduce the number of bits needed to represent the compressed waveform.

The distortion measure may be a weighted average of a plurality of error measures derived from the comparison of the reconstructed estimate with the original waveform, the filtered waveform, or the stacked waveform. The distortion measure includes at least one measure of the accuracy of at least one perceptual parameter. Some embodiments may further enable a user to specify (through a Graphical User Interface (GUI)) the set of perceptual parameters to be measured and used for a distortion criterion. Likewise, the user may further specify the weights associated with each perceptual parameter or other distortion measures and/or criterion limits either linear or nonlinear in nature. These embodiments may then configure the downhole system embodiment with the user specified distortion measure/threshold through some predetermined communication protocol allowing for fine tuning of the perceptual based distortion measure and/or the calibration of any particular realization of downhole embodiments. Linear threshold embodiments may be described as a linear weighted sum of various perception measures and/or errors. A non-linear threshold embodiment may piecewise link multiple perceptual criteria in a gated/serial/if-then-else fashion. For example, if the reconstructed first break time is off more than 3 msec from the original received waveform, then the downhole processor may reject the current set of compression parameters and compress by some other parameter set. Otherwise, the downhole processor may go on to further check the sign of the largest (absolute amplitude) peak of the reconstructed waveform with a programmable threshold and reject the current compression parameters for failure to satisfy this criterion, and so forth.

Perceptual parameters may include the "the first break" (i.e. start of the received waveform from the acoustic source), peak amplitude of principle reflections within the received waveform, the sign of principle reflections, general shape of the received digital waveform, arrival time and amplitude of "Stoneley Waves," and the perceived end of the seismic waveform where the waveform's energy has dissipated below a threshold. One skilled in the art may identify many more perceptual parameters. Additional perceptual parameters may include features of the P-wave portion of the received seismic waveform, such as the detected beginning, the spectral content of the P-wave's dominant frequency, the magnitude of the P-wave's peak amplitude, the sign corresponding to the P-wave's peak magnitude. Similarly, additional perceptual parameters may include features of the S-wave portion of the received seismic waveform, such as the detected beginning, the magnitude of the S-wave's peak, the spectral content of the S-wave's dominate frequency, the magnitude of the S-wave's peak amplitude, and the sign corresponding to the S-wave's peak magnitude. One skilled in the art may identify many more parameters that facilitate perceptual understanding of the received waveform.

In one illustrative embodiment a 50% weight is applied to the first break point timing accuracy, 20% weight to the sign accuracy of the first break point, 20% weight to exceeding the amplitude value threshold, and the remaining 10% on the general shape of the encoded waveform relative to the received acoustic waveform (as measured by mean square error). These weights, the corresponding thresholds, and any goals or absolute limits on bit counts can be specified and changed via a user interface to configure the operation of the downhole tool before it is placed in the borehole or during the drilling run.

Figure 4:
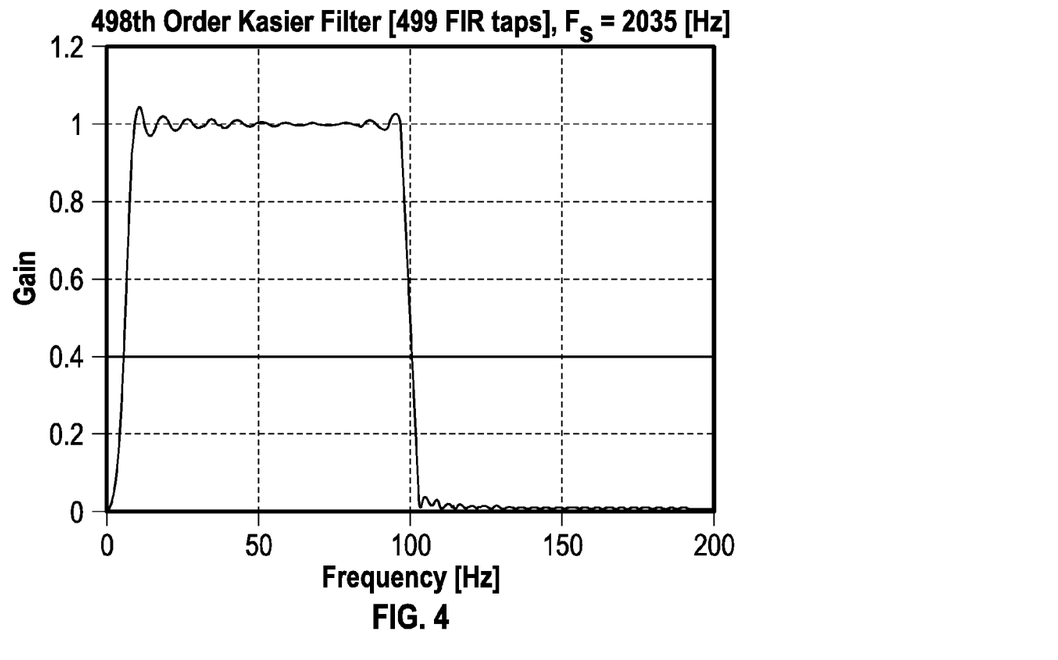
FIG. 4 shows an illustrative Kaiser band-pass filter to remove 0 Hz offset and frequencies above 100 Hz.
Figure 5:
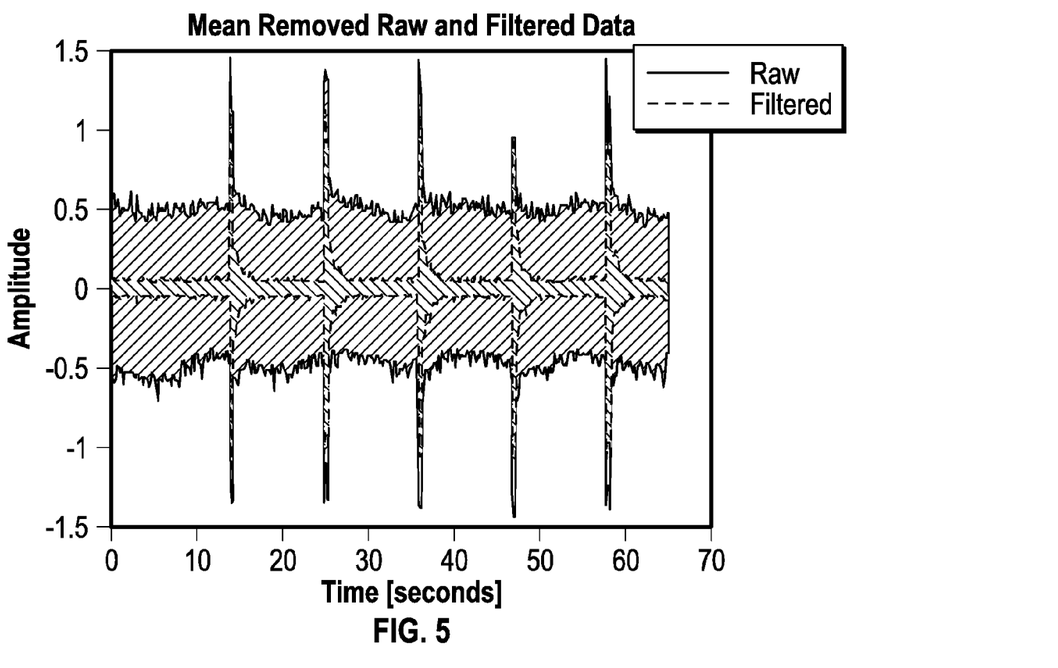
FIG. 5 shows illustrative overlaid received and band-passed filtered acoustic waveforms from 5 air-gun check-shots.
Figure 6:
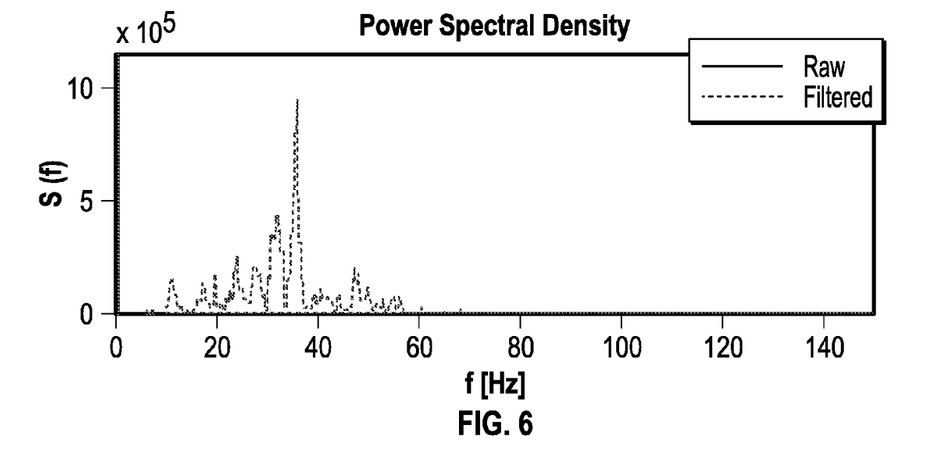
FIG. 6 compares illustrative spectral content of the original and filtered signal.
Figure 7A:
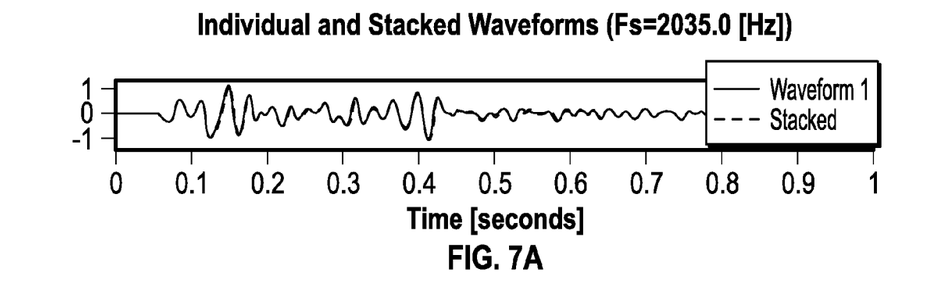
FIGS. 7A-7E compares an illustrative "stacked" waveform with the individual filtered check-shots at the original sampling rate of 2035 Hz.
Figure 7B:
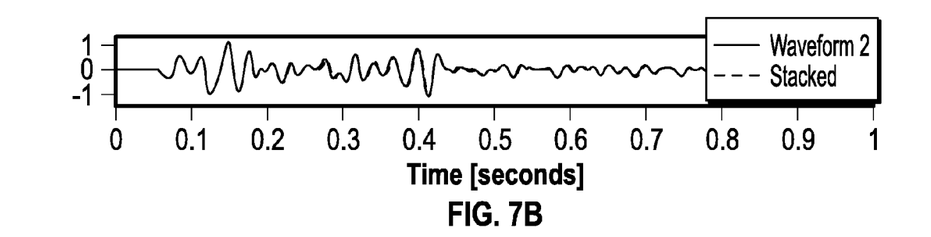
Figure 7C:
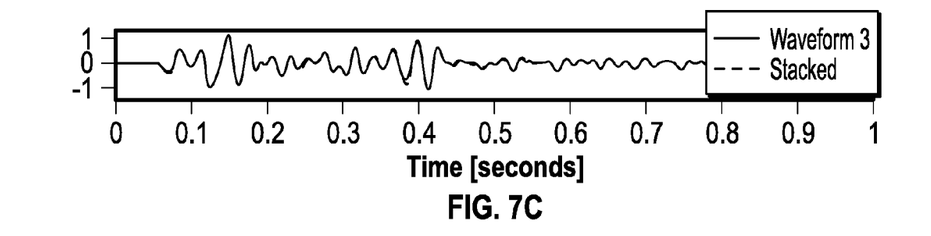
Figure 7D:
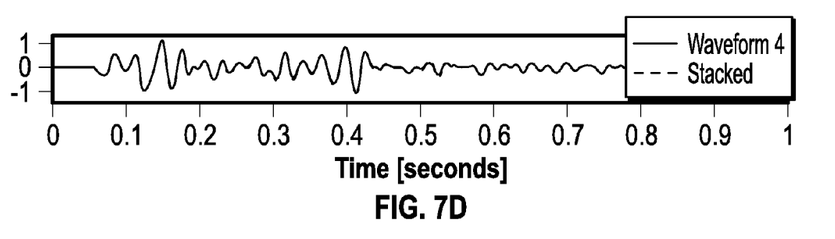
Figure 7E:
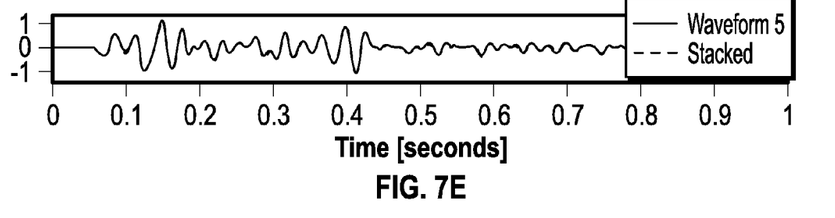

Certain elements of FIG. 3 are now described with additional detail and alternative embodiments. In at least some embodiments, the A/D converter 306 digitizes each transducer signal with 32 bits/sample at a sampling frequency of 2035 samples/sec for at least 2 minutes after the triggering of the source. The bandpass filter 310 may have a frequency response such as that indicated in FIG. 4, effectively suppressing any frequency content outside of the 5 Hz to 100 Hz band. FIG. 5 compares the filter's input and output for an illustrative waveform, showing that a large portion of the signal energy is excluded by this filter. FIG. 6 compares the power spectral density of these waveforms. Aside from the excluded spike at 0 Hz, the power spectral densities of these two waveforms are largely identical in the illustrated frequency range between 0 and 150 Hz.

Returning to FIG. 5, the illustrative waveform exhibits five arrivals corresponding to the sequential firings of the source. The acoustic detector 312 identifies the windows associated with each arrival. Some detector embodiments perform correlation of portions of the received acoustic waveforms containing temporal peak energy with other portions of the received acoustic waveforms. These locations of correlation peaks correspond to repetitive checkshots at predetermined intervals. Thus certain detector embodiments include a correlation module; a peak energy detector; a synchronizer module and storage memory for containing the starting locations of a plurality of times at least in part related to peak auto correlation values.

Other detection embodiments process the entire signal in time and/or frequency to detect P-wave and/or S-wave arrival times. As one example, we define the average absolute value of a signal x[k] in a symmetric window of length N around a sample number n as:

$$A = \frac{1}{N} \sum_{i=-N/2}^{i=\frac{N}{2}-1} |x[n-i]|$$

Two window lengths can be defined, i.e., a short term window and a long term window, where N for the short term window is less than that for the long term window. Denoting the average absolute value for the short term window as STA and the average absolute value for the long term window as LTA, the ratio STA/LTA can be used as a detector for P-wave arrival times in the received acoustic signal [1]. The STA is more sensitive to sudden amplitude variations in the time series, whereas the LTA is calculated over a longer window and hence is more sensitive to background noise, causing the ratio to provide a measure of signal-to-noise ratio in the considered time window of the STA [4]. Of course, a ratio of root-mean-square values or other detection techniques could also be employed.

The operation of stacker 314 is straightforward and in some cases may be optional. After the filtered waveform of FIG. 5 has been divided into five waveforms, the stacker 314 averages them together. FIGS. 7A-7E compare each of the individual waveforms to the stacked waveform. The minor discrepancies can be seen only under close inspection. In alternative system embodiments (e.g., those employing a Vibroseis source) the waveform may be much longer making it infeasible (and probably unnecessary) to perform a stacking operation.

Figure 8A:
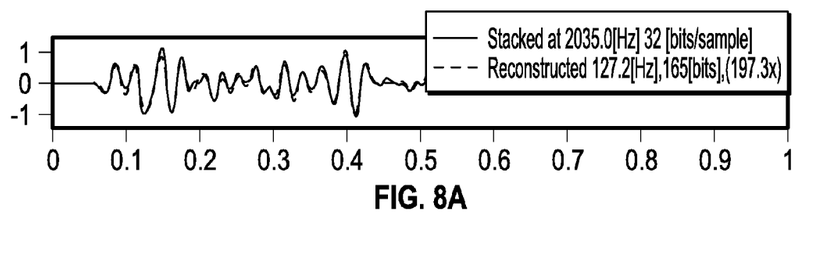
FIGS. 8A and 8B compare a first illustrative stacked waveform to reconstructed waveforms with different compressions.

FIG. 8A compares an illustrative stacked waveform with an estimated waveform reconstructed from a compressed wave form. The compression parameters for this waveform were a 512 msec window, leading zeros omitted in favor of a first break time tag, an anti-aliasing filter (Lowpass $8^{th}$ order Chebyshev Type I) cutoff frequency of 101.75 Hz, a downsampled rate of 127.2 samples/sec, and 3 bits per sample (including one sign bit per sample). The compressed waveform is representable as 165 bits. Inspection reveals the reconstructed waveform to be fairly accurate.

Figure 8B:
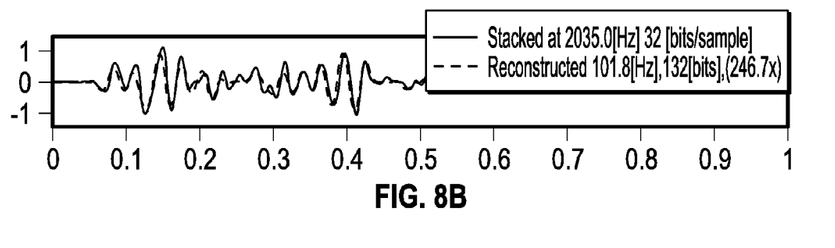
Figure 9A:
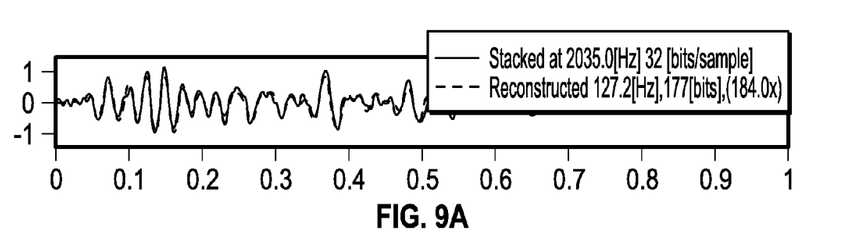
FIGS. 9A and 9B compare a second illustrative stacked waveform to reconstructed waveforms with different compressions.
Figure 9B:
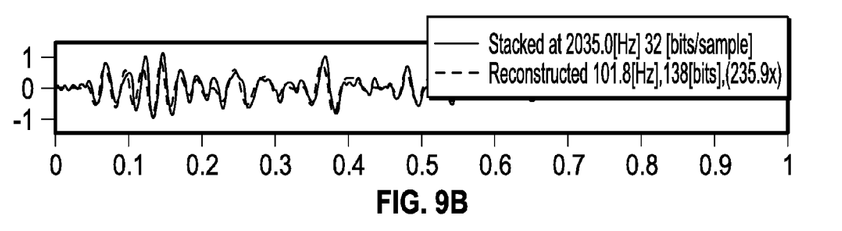
Figure 10A:
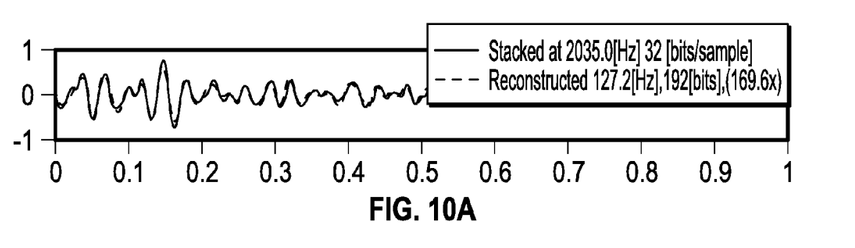
FIGS. 10A and 10B compare a third illustrative stacked waveform to reconstructed waveforms with different compressions.
Figure 10B:
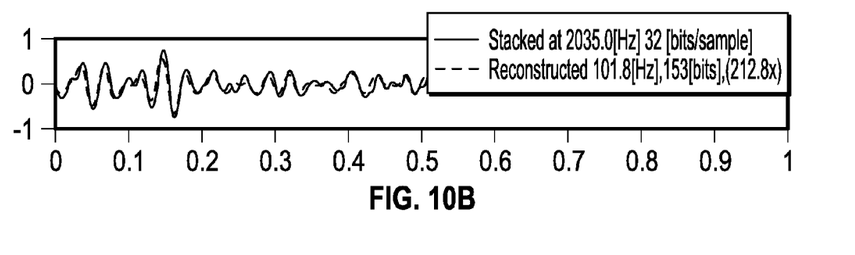

FIG. 8B compares the stacked waveform of FIG. 8A to a reconstruction of an even more compressed waveform, which may be allowed by the user relaxing a distortion limit. The compression parameters are the same except for a downsampled rate of 101.8 samples/sec, enabling a 132 bit representation. Several of the peaks are attenuated, but the waveform shape is largely preserved.

The foregoing comparison is repeated for two other illustrative waveforms in FIGS. 9A and 9B, and 10A and 10B. The bit representations for the second illustrative waveform are 177 bits and 138 bits, respectively. For the third illustrative waveform, the bit representations are 192 bits and 153 bits, respectively. The increased bit counts are primarily attributable to the reduced number of leading zeros in these waveforms. As before, the more severe compression exhibits some distortion relative to the stacked waveform, but the character of the waveforms is largely preserved. Compression is thus successfully achieved without requiring any predefined templates of any sort.

As module 304 stores and/or transmits the compressed waveform, it may employ an entropy code to achieve further compression. Illustrative examples include Huffman coding and arithmetic coding. The corresponding receiver or reconstruction modules would similarly employ appropriate decoders. Module 304 may further include attaching or associating a time tag for each waveform and at least one digital indicator representing the compression parameters used to generate the compressed waveform (i.e., the combination of filter, downsampler, and quantizer settings). In addition, module 304 may also provide a gain term, which in some embodiments can be determined in part by the sample variance and/or peak absolute amplitude of a first received waveform. The gain term (or some function thereof, including the square root) may be applied to the waveform to normalize it. The gain term is communicated to the receiver and/or reconstruction module so that the normalization can be reversed as part of the waveform reconstruction. The normalization can be performed in an absolute fashion or in a relative fashion. That is, some embodiments adjust the scale of a first reconstructed waveform in relation to a second reconstructed waveform that may be received before or after the first waveform.

The time tags may take the form of at least one digital clock reference indicator which can correspond to the detected first break along with the compressed representation of a received waveform, and which may be expressed relative to another digital clock reference indicator, as differential representations may require fewer bits. This reference indicator may be the lower significant digits of a time difference with respect to a universal clock reference point enabling at least in part time synchronization between surface and downhole systems.

In some embodiments, leading zeros may be omitted in favor of a time reference to the "first break". The receiver will then append appropriately leading zeros to reconstructed waveforms.

Thus, in the receiver or reconstruction modules, the compressed waveforms are received or read from memory and used to reconstruct an estimate of the acoustic waveforms captured downhole. An indication of the compression parameters is similarly received or read from memory and used as part of the reconstruction process to extend the bit resolution of the samples, to upsample the waveform with interpolation, to scale the waveform and associate it with an appropriate time interval or position, and to display a representation of the waveform to a user.

In one illustrative usage example, the SWD system employs an air gun that fires a timed series of 5 check-shots at a predetermined delay after the mud pumps are shut off. The BHA detects the pause in drilling by, e.g., downhole pressure change or a significant decrease in flow rate, and initiates a waveform acquisition cycle by the SWD tool. Based on preprogrammed parameters, the SWD tool determines the data acquisition window relative to the mud pump shutdown and acquires high-resolution acoustic waveforms from each of its sensors within that window. See, e.g., an illustrative raw waveform in FIG. 5. A bandpass filter (e.g., FIG. 4) may be applied to the data to isolate the signal in the frequency range of interest. An illustrative filtered signal is overlaid on the raw signal in FIG. 5 for comparison. The spectral content of the two signals is shown in FIG. 6. The 0 Hz component of the raw waveform has been excluded. Otherwise the spectral content is essentially identical in the frequency range of interest.

Based on the predetermined shot profile (e.g., a series of 5 check-shots), the SWD tool can extract the individual received waveforms as indicated in FIGS. 7A-7E. The individual waveforms may preferably be extracted from the bandpass filtered signal, though this is not required. To improve signal to noise ratio, the individual waveforms may be stacked, i.e., averaged together (although this too is not required). FIGS. 7a-7e show a comparison of an illustrative stacked waveform to each of the individual waveforms. The stacked waveform is subjected to compression as previously described and stored or transmitted to the surface. FIGS. 8a and 8b, FIGS. 9a and 9b, and FIGS. 10a and 10b, show three different waveforms, along with their compressed representations at different sampling rates. The bit count for each representation is also shown, along with a compression factor. Though distortion is visible, particularly at the higher compressions, the essential features of the waveforms are preserved.

On the topic of customization and compression, we have proposed using a user interface where a plurality of weights may be given to different perceptual features important to the user (generally a seismic waveform analyst). Using a plurality of perceptual parameters, we suggest adaptively adjusting the quantization, sampling and/or filter processing modules to assist in making real-time VSP waveforms available via mud-pulse telemetry. Likewise, we have suggested allowing for adjustable distortion thresholds as to customize the level of distortion acceptable to the driller or analyst. Similarly, this allows for the field engineer the capability to adapt the number of bits for a given time interval (or adapt the time window for a given number of bits).

On the topic of transmission, we have proposed sending the actual waveform rather than "quality" factors and/or wavelets from a codebook. Such transmission of real-time waveforms is desirable for competing in the SWD market. The technology is also applicable to other seismic and acoustic borehole applications (e.g., SONIC caliper, where the downhole tool will both excite the acoustic waveform and receive the reflected acoustic waveform from the surrounding rock formation).

In certain illustrative method embodiments, the SWD system excites an acoustic source a plurality of times just before, during and/or just after the beginning of predetermined time intervals; receives at least one acoustic signal within a borehole from surrounding rock formations; digitizes at least one the received acoustic signal with a first sampling rate/period; detects the first break time within the received acoustic signal; searches a plurality of configuration parameters (cutoff frequency, sampling rate and quantization) for an optimized configuration parameter set that reduces the required number of bits to represent the received waveform within a predetermined bit count threshold and still remain within a predetermined distortion measure threshold for a reconstructed acoustic signal; and digitally compresses the digitized acoustic signals according to the set of optimized parameters for storage or communication to the surface.

Certain surface system embodiments include a graphical user interface operating on a computer enabling a user to customize the weights placed on each a plurality of perception parameters within a set of weighted distortion criteria. These surface system embodiments further operate to configure downhole components with the weighted distortion criteria for use in optimizing the digital compression parameters (e.g. filtering, sampling rate, quantization, etc.) prior to storing and/or transmitting. Some embodiments may use multiple sets of perception parameters and/or distortion criteria for storage and transmission. Alternatively, some embodiments may use multiple sets of perception parameters for different depths, regions, anticipated drilling conditions and/or anticipated rock formations. (For example, the bit count limit may be progressively reduced at a corresponding rate as that expected for the mud pulse telemetry system operating at increasing depths.)

Certain downhole tool embodiments are synchronized with at least one surface system using predetermined shot time intervals. The downhole tool includes: at least one acoustic receiver (e.g. geophones, hydrophones) enabled to receive acoustic waveforms from the surrounding environment; at least one sampling module that digitizes/quantizes the acoustic waveforms; a filter with a programmable cutoff frequency; a programmable down-sampler; an adjustable re-quantizer; a processor detecting, selecting and/or processing the received digitized acoustic waveforms to store or transmit compressed representations. The downhole tool may further include a decoder to reconstruct/uncompress the encoded digitized waveform, wherein the processor compares the reconstructed waveform to the original to determine a distortion measure and a suitable set of compression parameters.

Additionally, the downhole tool may further include a storage memory (FLASH or RAM) storing either/or both the configuration inputs or/and encoded waveform once a distortion measure meets a desired threshold or/and the encoded waveform representation has a bit count falling below a desired bit count threshold. Additionally, a controller may selectively transmit encoded representations satisfying the thresholds. The controller may operate by storing each encoded waveform in nonvolatile memory and then removing or overwriting selective encoded waveforms.

Additionally, the downhole tool may further determine, store, and/or transmit a digital clock value representing a detected first-break time in each waveform. Similarly, the downhole tool may further determine, store, and/or transmit a calculated distortion measure corresponding to each encoded waveform.

Numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A seismic while drilling system comprising:
a drill string having at least one seismic sensor;
an embedded processor that digitizes a signal from the seismic sensor to obtain a digital waveform and processes the digital waveform to derive a compressed waveform representation for storage or transmission, the compressed waveform representation having an adjusted sampling rate and adjusted quantization relative to the digital waveform, the adjusted sampling rate and adjusted quantization being adaptive based on a measure of distortion between the digital waveform and the compressed waveform representation; and
a surface computer system that derives a distortion measure comprising a weighted average or weighted sum of at least two perceptual parameters;
wherein each of the at least two perceptual parameters is associated with a weight, and the perceptual parameters are selected from the group consisting of: first break characteristics, peak amplitude of principle reflections, sign of principle reflections, general shape of the digital waveform, arrival time and amplitude of Stoneley Waves, sign accuracy of the first break point, and the end of a seismic waveform received by the seismic sensor.

2. The system of claim 1, further comprising a mud pulse telemetry module coupled to the embedded processor to communicate the compressed waveform representation to a surface of the Earth with an associated indication of the adjusted sampling rate and adjusted quantization.

3. The system of claim 2, wherein the surface computer system receives the compressed waveform representation and based at least in part on the compressed waveform representation, displays a representation of the signal from the seismic sensor.

4. The system of claim 1, further comprising a storage memory coupled to the embedded processor, wherein the storage memory stores the compressed waveform representation with an associated indication of the adjusted sampling rate and adjusted quantization.

5. The system of claim 1, wherein the distortion measure includes a measure of mean square error between the digital waveform and a reconstructed waveform, the reconstructed waveform derived from the compressed waveform representation.

6. The system of claim 1, wherein the embedded processor further employs entropy coding to derive the compressed waveform representation.

7. The system of claim 1, wherein the embedded processor further bases the adaptation of the adjusted sampling rate and adjusted quantization in part on a bit count limit for the compressed waveform representation.

8. The system of claim 1, further comprising a surface seismic source that fires when drilling fluid pumps are off.

9. A method comprising:
exciting an acoustic source a plurality of times;
receiving at least one acoustic signal within a borehole from surrounding rock formations;
digitizing the at least one acoustic signal; and
adaptively compressing the digitized signal subject to a distortion measure comprising a weighted average or weighted sum of at least two perceptual parameters, each of the at least two perceptual parameters is associated with a configurable weight, and the perceptual parameters are selected from the group consisting of: first break characteristics, peak amplitude of principle reflections, sign of principle reflections, general shape of the digital waveform, arrival time and amplitude of Stoneley Waves, sign accuracy of the first break point, and the end of a seismic waveform received by the seismic sensor.

10. The method of claim 9, wherein the compressing includes filtering the digitized signal with a downsampling filter.

11. The method of claim 10, wherein the compressing further includes adjusting a sampling rate of the digitized signal.

12. The method of claim 11, wherein the compressing still further includes adjusting quantization of the digitized signal to obtain a compressed waveform representation.

13. The method of claim 12, wherein the compressing still further includes entropy coding the compressed waveform representation.

14. The method of claim 13, wherein the compressing still further includes:
deriving a reconstructed waveform from the compressed waveform representation;
comparing the compressed waveform representation to the digitized signal to determine if the distortion measure is satisfied; and
adjusting at least one of the filter, the sampling rate, and the quantization if the distortion measure is not satisfied.

15. The method of claim 14, further comprising associating the compressed waveform representation with an indication of a set of compression parameters employed in the compression, the compression parameters including at least a sampling rate of the compressed waveform representation.

16. A method comprising:
exciting an acoustic source a plurality of times;
receiving at least one acoustic signal within a borehole from surrounding rock formations;
digitizing the at least one acoustic signal; and
adaptively compressing the digitized signal subject to a distortion measure comprising at least two perceptual parameter thresholds configured in serial dependent fashion, each of the at least two perceptual parameter thresholds is associated with a weight, and the perceptual parameter thresholds are selected from the group consisting of: first break characteristics, peak amplitude of principle reflections, sign of principle reflections, general shape of the digital waveform, arrival time and amplitude of Stoneley Waves, sign accuracy of the first break point, and the end of a seismic waveform received by the seismic sensor.

17. The method of claim 16, wherein the serial dependent fashion comprises passing a first perceptual parameter threshold to check a second perceptual parameter threshold, otherwise not checking the second perceptual parameter threshold and instead rejecting compression parameters of the compressing.

* * * * *